United States Patent
Liu et al.

(10) Patent No.: US 9,239,269 B1
(45) Date of Patent: Jan. 19, 2016

(54) CALIBRATION OF PHOTOELECTROMAGNETIC SENSOR IN A LASER SOURCE

(71) Applicant: ASML Netherlands B.V., Veldhoven (NL)

(72) Inventors: Rong Liu, San Diego, CA (US); Robert J. Rafac, Encinitas, CA (US); David Wayne Myers, Poway, CA (US); Robert A. Bergstedt, Carlsbad, CA (US); Paul Alexander McKenzie, Encinitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 24 days.

(21) Appl. No.: 14/330,526

(22) Filed: Jul. 14, 2014

(51) Int. Cl.
| | |
|---|---|
| *G01J 5/00* | (2006.01) |
| *G01J 11/00* | (2006.01) |
| *H05G 2/00* | (2006.01) |
| *G01J 1/42* | (2006.01) |
| *G02B 27/00* | (2006.01) |
| *H01S 5/042* | (2006.01) |

(52) U.S. Cl.
CPC ............. *G01J 11/00* (2013.01); *G01J 1/4257* (2013.01); *G02B 27/0025* (2013.01); *H01S 5/042* (2013.01); *H05G 2/008* (2013.01); *G01J 2001/4238* (2013.01)

(58) Field of Classification Search
CPC ................. G01J 5/20; G01J 5/08; G01J 5/02; G01J 5/10; H04N 5/33
See application file for complete search history.

(56) References Cited

U.S. PATENT DOCUMENTS

| | | | |
|---|---|---|---|
| 2006/0153256 A1* | 7/2006 | Sanchez ................. H01S 5/042 372/34 |
| 2015/0098072 A1* | 4/2015 | Dinger ............... G02B 27/0025 355/71 |

* cited by examiner

*Primary Examiner* — David Porta
*Assistant Examiner* — Mamadou Faye
(74) *Attorney, Agent, or Firm* — Gard & Kaslow LLP

(57) ABSTRACT

In a laser-produced plasma (LPP) extreme ultraviolet (EUV) system, laser pulses are used to produce EUV light. To determine the energy of individual laser pulses, a photoelectromagnetic (PEM) detector is calibrated to a power meter using a calibration coefficient. When measuring a unitary laser beam comprising pulses of a single wavelength, the calibration coefficient is calculated based on a burst of the pulses. A combined laser beam has main pulses of a first wavelength alternating with pre-pulses pulses of a second wavelength. To calculate the energy of the main pulses in the combined laser beam, the calibration coefficient calculated for a unitary laser beam of the main pulses is used. To calculate the energy of the pre-pulses in the combined laser beam, a new calibration coefficient is calculated. When the calculated energy values drift beyond a pre-defined threshold, the calibration coefficients are recalculated.

11 Claims, 12 Drawing Sheets

CALIBRATION OF PHOTOELECTROMAGNETIC SENSOR IN A LASER SOURCE

BACKGROUND

1. Field

The present application relates generally to laser systems and, more specifically, to calibration of a photoelectromagnetic sensor in a laser source of a laser produced plasma (LPP) extreme ultraviolet (EUV) system.

2. Related Art

The semiconductor industry continues to develop lithographic technologies which are able to print ever-smaller integrated circuit dimensions. Extreme ultraviolet ("EUV") light (also sometimes referred to as soft x-rays) is generally defined to be electromagnetic radiation having wavelengths of between 10 and 102 nm. EUV lithography is generally considered to include EUV light at wavelengths in the range of 10-14 nm, and is used to produce extremely small features (e.g., sub-32 nm features) in substrates such as silicon wafers. These systems must be highly reliable and provide cost-effective throughput and reasonable process latitude.

Methods to generate EUV light include, but are not necessarily limited to, converting a material into a plasma state that has one or more elements (e.g., xenon, lithium, tin, indium, antimony, tellurium, aluminum, etc.) with one or more emission line(s) in the EUV range. In one such method, often termed laser-produced plasma ("LPP"), the required plasma can be generated by irradiating a target material, such as a droplet, stream or cluster of material having the desired line-emitting element, with a laser beam at an irradiation site within an LPP EUV source plasma chamber.

FIG. 1 illustrates some of the components of a prior art LPP EUV system 100. A laser source 101, such as a $CO_2$ laser, produces a laser beam 102 that passes through a beam delivery system 103 and through focusing optics 104 (comprising a lens and a steering mirror). Focusing optics 104 have a primary focus point 105 at an irradiation site within an LPP EUV source plasma chamber 110. A droplet generator 106 produces droplets 107 of an appropriate target material that, when hit by laser beam 102 at the primary focus point 105, generate a plasma which irradiates EUV light. An elliptical mirror ("collector") 108 focuses the EUV light from the plasma at a focal spot 109 (also known as an intermediate focus position) for delivering the generated EUV light to, e.g., a lithography scanner system (not shown). Focal spot 109 will typically be within a scanner (not shown) containing wafers that are to be exposed to the EUV light. In some embodiments, there may be multiple laser sources 101, with beams that all converge on focusing optics 104. One type of LPP EUV light source may use a $CO_2$ laser and a zinc selenide (ZnSe) lens with an anti-reflective coating and a clear aperture of about 6 to 8 inches.

The laser source 101 can be operated in a burst mode where a number of light pulses are generated in a burst with some amount of time between bursts. The laser source 101 may comprise a number of lasers that generate pulsed laser beams having distinct properties, such as wavelength, and/or pulse length. Within the laser source 101, the beam delivery system 103, and the focusing optics 104, the separate laser beams may be combined, split, or otherwise manipulated.

Before the laser beam 102 reaches the LPP EUV source plasma chamber 110, the beam 102 is measured at various points within the laser source 101, the beam delivery system 103, and/or the focusing optics 104. The measurements are taken using a variety of instruments that measure one or more aspects of the laser beam 102. In some instances, the laser beam 102 may be measured before it is combined with other generated beams or after it has been combined. The instruments, however, may not directly measure certain properties of the laser beam 102 or may be not be calibrated in such a way as to measure the properties of the laser beam 102.

SUMMARY

According to an embodiment, a system comprises: an energy monitor within a laser-produced plasma (LPP) extreme ultraviolet (EUV) system, the energy monitor configured to measure a laser beam comprising pre-pulses and main pulses separated by a length of time, the energy monitor comprising: a power meter configured to sense an average power of the series of laser pulses over a defined period of time, and a photoelectromagnetic (PEM) detector configured to provide a voltage signal depicting a temporal profile of the first pre-pulse separated from the first main pulse by the length of time during a portion of the defined period of time; a calibration module configured to determine a power of the first main pulse based on a main pulse calibration coefficient and a pulse integral of a portion of the voltage signal corresponding to the first main pulse, to determine a power of the first pre-pulse based on the average power and the power of the first main pulse, and to determine a pre-pulse calibration coefficient based on the power of the first pre-pulse and an integral of a portion of the voltage signal corresponding to the first pre-pulse; and a single pulse energy calculation (SPEC) module configured to determine an energy of a second pre-pulse based on the pre-pulse calibration coefficient and a pulse integral of a portion of a second voltage signal provided by the PEM detector corresponding to the second pre-pulse, and to determine an energy of a second main pulse based on the main pulse calibration coefficient and a pulse integral of a portion of the second voltage signal to the second main pulse.

The system may further comprise a recalibration module configured to calculate an energy of the laser beam over a second defined period of time based on the second voltage signal provided by the PEM and configured to compare the calculated energy of the laser beam to the average power sensed by the power meter over the second defined period of time and to instruct to the calibration module to update the pre-pulse calibration coefficient based on the comparison.

According to an embodiment, a method comprises: receiving a measurement of a laser beam comprising pre-pulses and main pulses using an energy monitor within a laser-produced plasma (LPP) extreme ultraviolet (EUV) system, the measurement of the laser beam comprising: an average power of the series of laser pulses over a defined period of time measured using a power meter, and a first voltage signal depicting a temporal profile of a first pre-pulse of the pre-pulses separated from a first main pulse of the main pulses by a length of time, the first voltage signal provided by a photoelectromagnetic (PEM) detector; determining a power of the first main pulse based on a main pulse calibration coefficient and an integral of a portion of the first voltage signal corresponding to the first main pulse; determining a power of the first pre-pulse based on the average power and the power of the first main pulse; determining a pre-pulse calibration coefficient based on the power of the first pre-pulse and an integral of a portion of the first voltage signal corresponding to the first pre-pulse; determining an energy of a second pre-pulse based on the pre-pulse calibration coefficient and an integral of a portion of a second voltage signal provided by the PEM detector corresponding to the second pre-pulse; and determining an energy of a second main pulse based on the main pulse calibration coefficient and an integral of a portion of the second voltage signal corresponding to the second main pulse.

According to an embodiment, a non-transitory computer-readable medium has instructions embodied thereon, the instructions executable by one or more processors to perform operations comprising: receiving a measurement of a laser beam comprising pre-pulses and main pulses using an energy monitor within a laser-produced plasma (LPP) extreme ultra-violet (EUV) system, the measurement of the laser beam comprising: an average power of the series of laser pulses over a defined period of time measured using a power meter, and a first voltage signal depicting a temporal profile of a first pre-pulse of the pre-pulses separated from a first main pulse of the main pulses by a length of time, the first voltage signal provided by a photoelectromagnetic (PEM) detector; determining a power of the first main pulse based on a main pulse calibration coefficient and an integral of a portion of the first voltage signal corresponding to the first main pulse; determining a power of the first pre-pulse based on the average power and the power of the first main pulse; determining a pre-pulse calibration coefficient based on the power of the first pre-pulse and an integral of a portion of the first voltage signal corresponding to the first pre-pulse; determining an energy of a second pre-pulse based on the pre-pulse calibration coefficient and an integral of a portion of a second voltage signal provided by the PEM detector corresponding to the second pre-pulse; and determining an energy of a second main pulse based on the main pulse calibration coefficient and an integral of a portion of the second voltage signal corresponding to the second main pulse.

DETAILED DESCRIPTION

Within an LPP EUV system, the energy of a laser pulse is calculated at various locations in the laser source, the beam delivery system, and/or the focusing optics. The sensors used in an LPP EUV system to measure a laser beam do not directly measure the energy of a pulse of the laser beam. The sensors include a power meter that provides a measurement of the average power of the pulses generated over a defined period of time. The sensors further include a photoelectromagnetic (PEM) detector that outputs a voltage signal based on detected infrared (IR) light over a limited period of time. The voltage signal provides a temporal profile of the individual laser pulses. Using the data collected by the sensors, a calibration coefficient is calculated to calibrate the PEM detector to the power meter. After the calibration, the energy of the pulses can be calculated from the voltage signal provided by the PEM detector.

The laser beam being measured can comprise pulses of light of the same wavelength, referred to as a unitary laser beam. The unitary laser beam may comprise either pre-pulses of a first wavelength or main pulses of a second wavelength. To determine the energy of a pulse of light in a unitary laser beam, the PEM detector is calibrated to the power meter by calculating a calibration coefficient for the unitary laser beam. For a unitary laser beam, the calibration coefficient is a ratio based on a measurement received from the power meter and the voltage signal provided by the PEM detector over a burst. After calibration, the calibration coefficient and the voltage signal provided by the PEM detector are used to calculate the energy of the pulses in the unitary laser beam.

In the LPP EUV system, when two unitary laser beams of different wavelengths are combined, the resulting combined laser beam has pulses of alternating wavelength separated in the time domain. In the embodiments described herein, the pulses in the combined laser beam alternate between the pre-pulses of the first wavelength and the main pulses of the second wavelength. When calculating the energy of a main pulse in the combined laser beam, the calibration coefficient calculated from the unitary laser beam of main pulses is used. Due to the different effects of the optical components in the LPP EUV system between the pre-pulses and the main pulse in the combined laser beam, a separate calibration coefficient of the pre-pulses in the combined laser beam is calculated. The calibration coefficient of the pre-pulses is determined based on a difference between the power measured by the power meter and the power attributable to the main pulses in the combined laser beam. After calibration, the calibration coefficient and the voltage signal provided by the PEM detector are used to calculate the respective energies of pre-pulses and main pulses in the combined laser beam.

Figure 1:
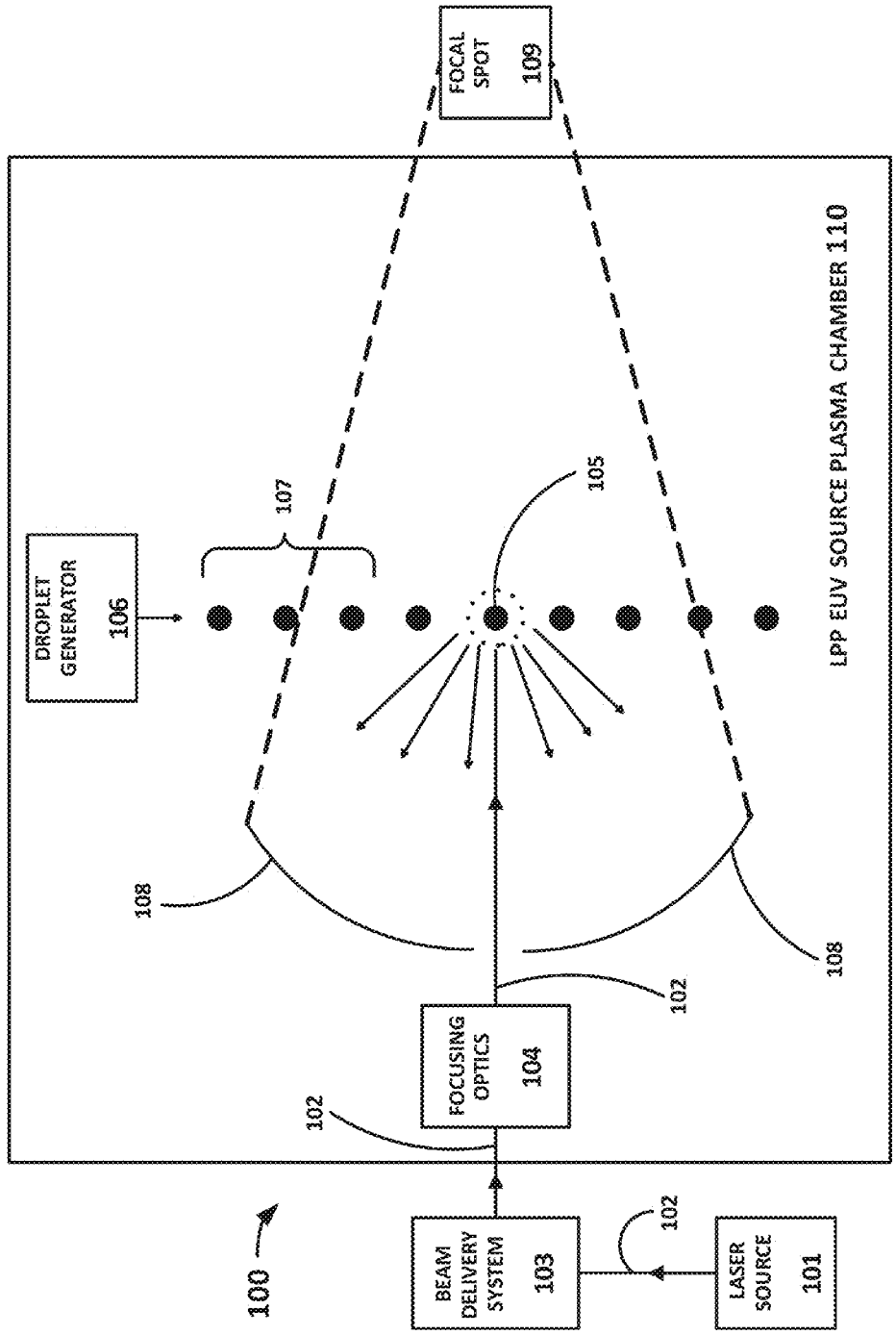
FIG. 1 is a diagram of a portion of an LPP EUV system according to the prior art.
Figure 2:
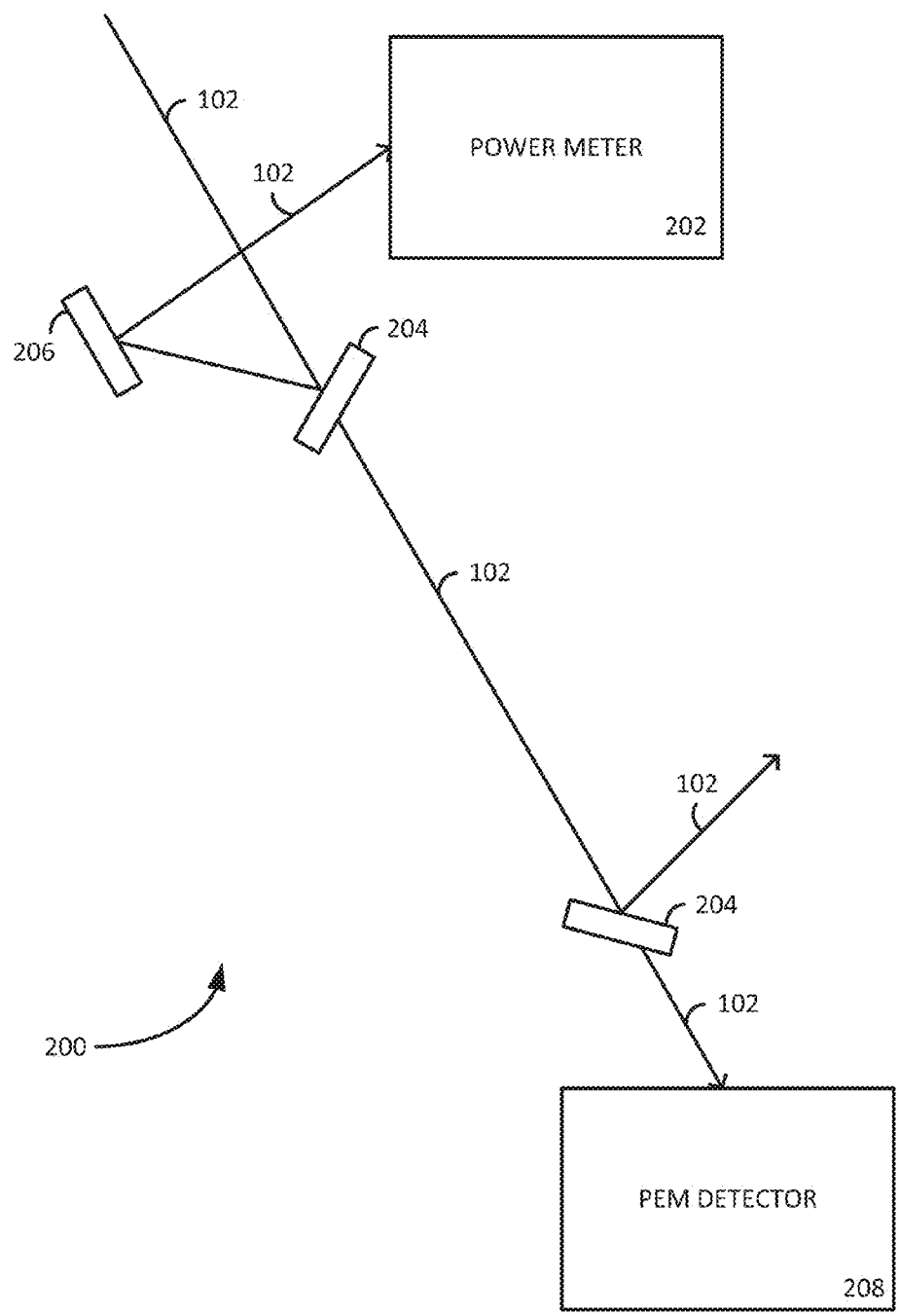
FIG. 2 is a diagram of an energy monitor according to an example embodiment.

FIG. 2 is a diagram of an energy monitor 200 according to an example embodiment, comprising a power meter 202 and a PEM detector 208. The energy monitor 200 may receive the laser beam 102 from another component within the laser source 101 using, for example, a beam splitter. As would be apparent to one of ordinary skill in the art, before reaching the energy monitor 200, the laser beam 102 travels through one or more optical components to pick-off a portion of the laser beam 102 for measurement. These optical components may include a diamond window, a partial reflector, or a Zinc Selenide window. An example of a laser seed module that can include the energy monitor 200 is discussed in commonly-assigned U.S. Patent Application Publication No. 2013/0321926 published Dec. 5, 2013.

The energy monitor 200 is located so as to measure the laser beam 102 at a particular place in the laser source 101, the beam delivery system 103, or the focusing optics 104. In some embodiments described herein, the placement of the energy monitor 200 causes the energy monitor 200 to measure a unitary laser beam 102 comprising laser pulses of light of the same wavelength (e.g., pre-pulses or main pulses). The laser pulses of light are generated by a single source but can be generated by more than one source in other systems. In other embodiments described herein, the placement of the energy monitor 200 causes the energy monitor to measure a combined laser beam 102 generated by two laser sources with different wavelengths. The laser source 101, beam delivery system 103, and the focusing optics 104 can include more than one energy monitor 200.

The laser beam 102 follows an optical path through the energy monitor 200. The laser beam 102 is split by a beam splitter 204 so that a first portion of the laser beam 102 continues along the optical path while the remainder of the laser beam 102 is directed to a reflector 206. The reflector 206, in turn, directs the remainder of the laser beam 102 to the power meter 202.

The power meter 202 is configured to measure the average power of the laser beam 102 over a defined period of time. The measurement may span a number of bursts of the laser beam 102. In some instances, the measurement may span 5, 10, or 20 bursts of the laser beam 102. The defined period of time may be a fraction of a second or a number of seconds. In some instances, the defined period of time is one second.

The portion of the laser beam 102 not directed to the power meter 202 is directed to a further beam splitter 204. From the beam splitter 204, a first portion of the laser beam is directed to, for example, further sensors or other optical components (not shown). The remainder of the laser beam 102 is directed to the PEM detector 208.

The PEM detector 208 provides a voltage signal that indicates a temporal profile of the laser beam 102. The temporal profile spans at least a portion of the defined period of time used by the power meter 202. The temporal profile may span at least a burst of the laser beam 102. To calculate the energy of pulses in a combined laser beam, the temporal profile spans a pre-pulse and a main pulse.

While only one PEM detector 208 is shown in FIG. 2, additional PEM detectors (not shown) may be included in the energy monitor 200. Further, the laser beam 102 may be modified before measurement by the PEM detector 208 using, for example, a lens (not shown) or diffuser set (not shown). The energy monitor 200 may be enclosed by a casing and attached to a port of the laser source 101 or be enclosed within the laser source 101.

Figure 9:
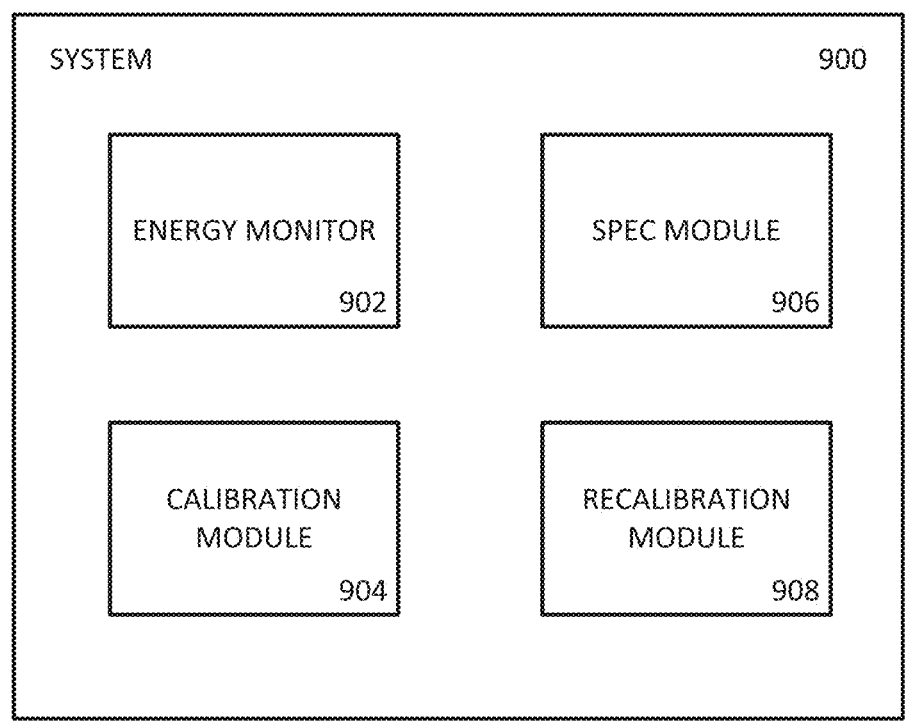
FIG. 9 is a block diagram of a system for measuring an energy of a pulse, according to an example embodiment.

FIG. 9 is a block diagram of a system 900 for measuring an energy of a pulse, according to an example embodiment. The system 900 comprises an energy monitor 902, a calibration module 904, a single pulse energy calculation (SPEC) module 906, and an optional recalibration module 908. The system 900 may be implemented in a variety of ways known to those skilled in the art including, but not limited to, as a computing device having a processor with access to a memory capable of storing executable instructions. The computing device may include one or more input and output components, including components for communicating with other computing devices via a network or other form of communication. The system 900 comprises one or more modules embodied in computing logic or executable code.

The energy monitor 902 is configured to receive data about the laser pulses of the laser beam 102. The energy monitor 902 comprises, or is in electronic communication with, a power meter and a PEM detector. In some instances, the energy monitor 902 is the energy monitor 200 comprising the power meter 202 and the PEM detector 208. The power meter is configured to measure an average power of the laser pulses over a defined period of time. The defined period of time may be, for example, one second. The PEM detector is configured to provide a voltage signal indicative of a temporal profile of the laser pulses over at least a portion of the defined period of time.

When the energy monitor 200 or 902 is placed in the LPP EUV system 100 so as to receive a unitary laser beam 102, the calibration module 904 is configured to determine a calibration coefficient based on the data collected by the power meter (e.g., power meter 202) and the PEM detector (e.g., PEM detector 208). A calibration coefficient is calculated for each unitary laser beam. The calibration coefficient is used to calculate the energy of a single pulse (e.g., single main pulse 502 or single pre-pulse 702) based on later-collected PEM detector data. The calibration coefficient is a ratio determined from the average power and an integral of the voltage signal.

Figure 3:
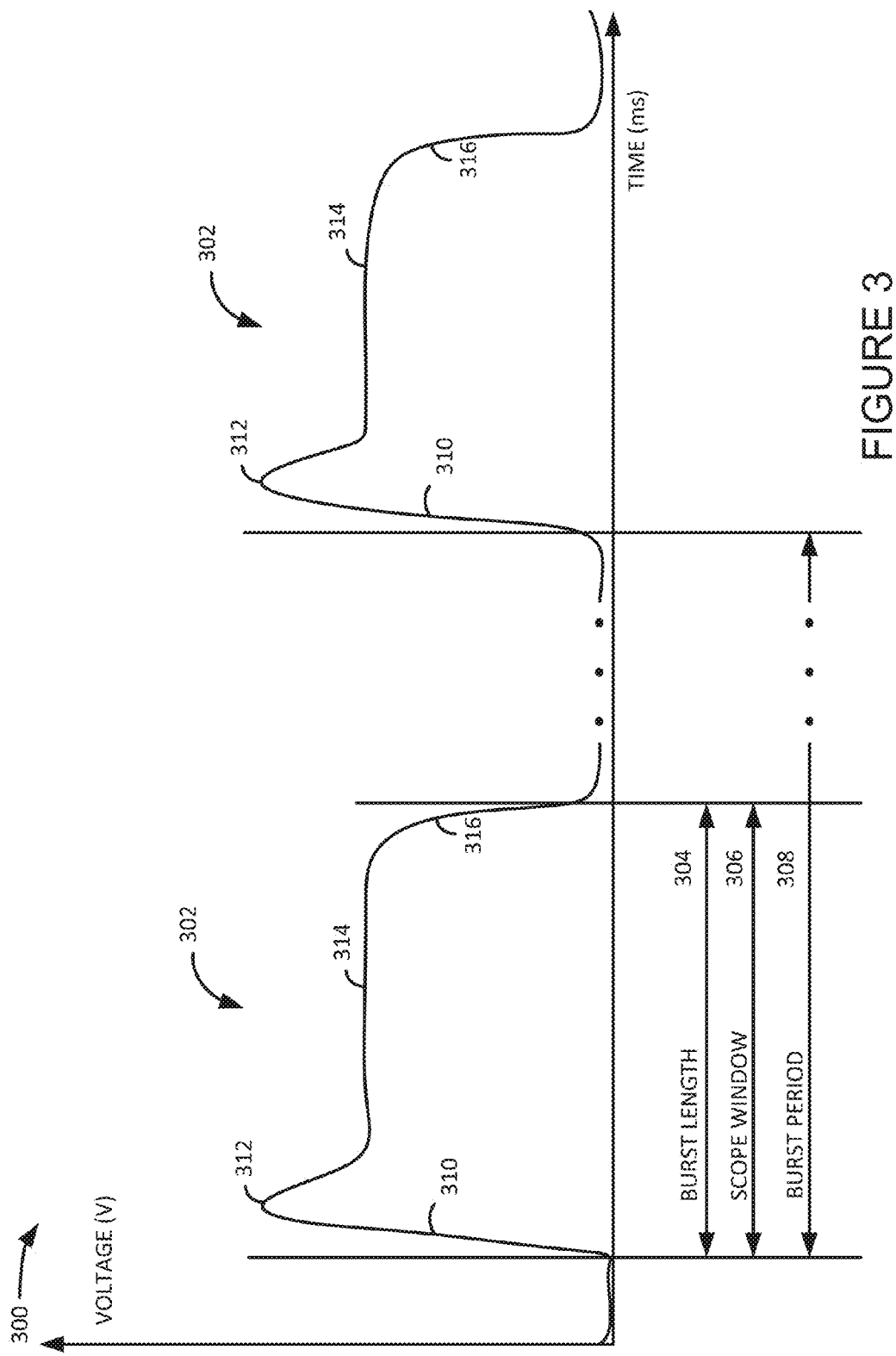
FIG. 3 is an illustration of a burst mode of a laser source, according to an example embodiment.

To determine the calibration coefficient in a unitary laser beam 102, bursts of pulses are analyzed. FIG. 3 is an illustration 300 of two bursts 302 of laser pulses, according to an example embodiment. The illustration 300 is an outline of a temporal profile provided by the PEM detector 208 depicted as a varying voltage as a function of time (measured in milliseconds (ms)).

Each burst 302 is depicted in the illustration 300 as a curve having a rising edge 310, peaking 312, then maintaining a voltage level 314 lower than a peak level for a length of time before ending with a falling edge 316. The burst 302 has a burst length 304 beginning at the rising edge 310 and ending at the falling edge 316. When calculating the energy of the burst 302 to calculate a calibration coefficient as is explained elsewhere herein, the PEM detector 208 has a scope window 306 that at least encompasses the burst length 304. The scope window 306 can be lengthened to capture the time between bursts 302 or shortened to capture only one or two pulses within the burst 302.

A burst period 308 is measured from the rising edge 310 of a first burst 302 to the rising edge 310 of a second burst 302. The burst period 308 can be determined from a repetition rate or "rep rate" of the bursts 302 indicating a number of bursts over a defined period of time (e.g., one second). The burst rep rate may be expressed as a frequency such as 5 Hertz (Hz), 10 Hz, or 20 Hz.

Figure 4:
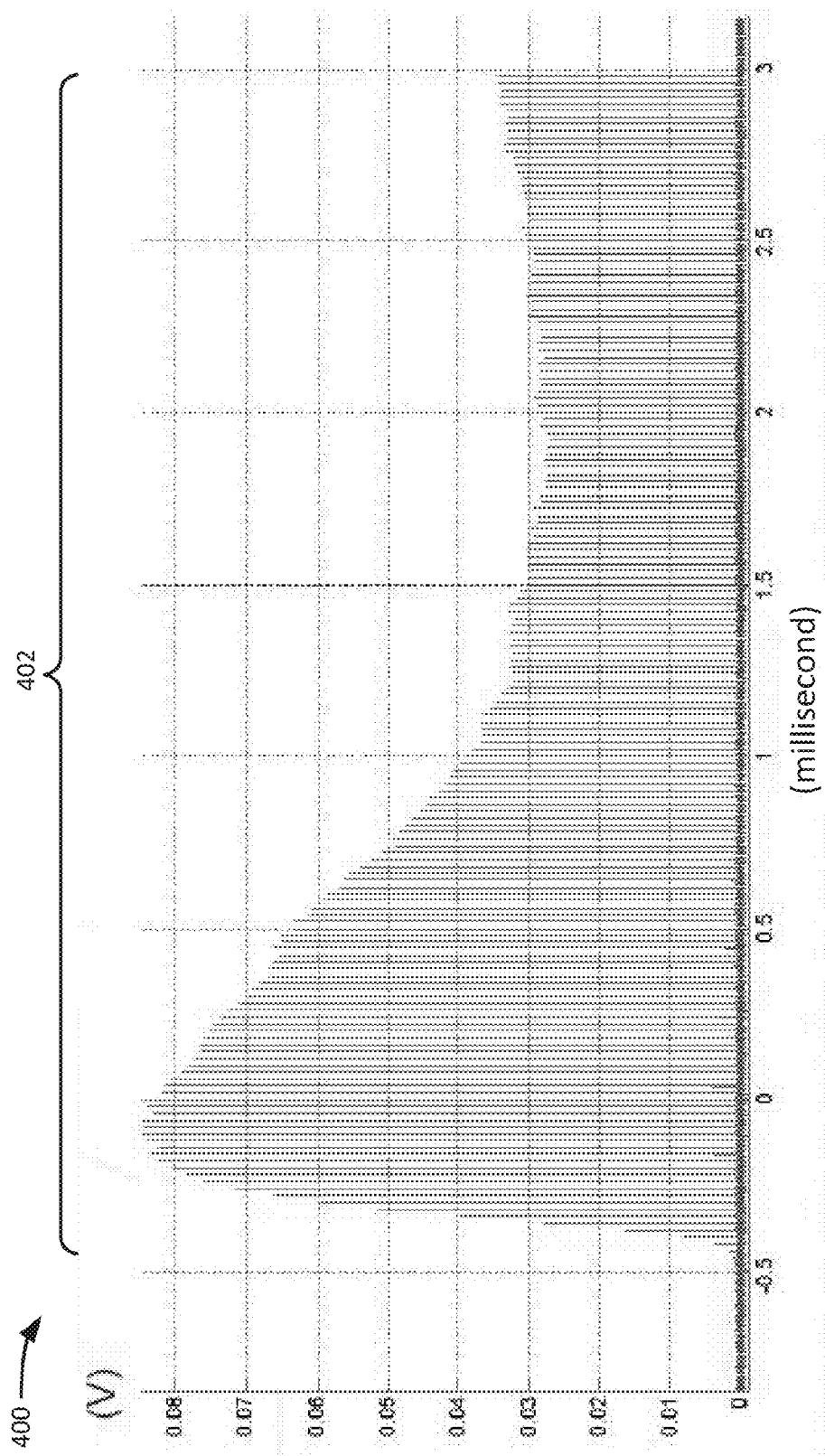
FIG. 4 is a graph output by a PEM detector depicting a temporal profile of a burst comprising main pulses.

FIG. 4 is a graph 400 depicting a temporal profile provided by the output of PEM detector 208 of a burst 402 of a unitary laser beam 102 that comprises main pulses. The graph 400 is an actual example of the output illustrated in FIG. 3. The unitary laser beam 102 is generated by a single source. In an embodiment, the main pulses have a wavelength of 10.59 microns. As depicted, the burst 402 lasts approximately 3.5 milliseconds and comprises a pre-determined number of laser pulses. According to various embodiments, a burst 402 may comprise different number of laser pulses based on the burst length. The laser pulses have a width (measured as a length of time) and an amplitude. As part of calculating the calibration coefficient, over a length of time shown in the graph 400, the calibration module 904 can integrate the pulses of the burst 402.

Figure 6:
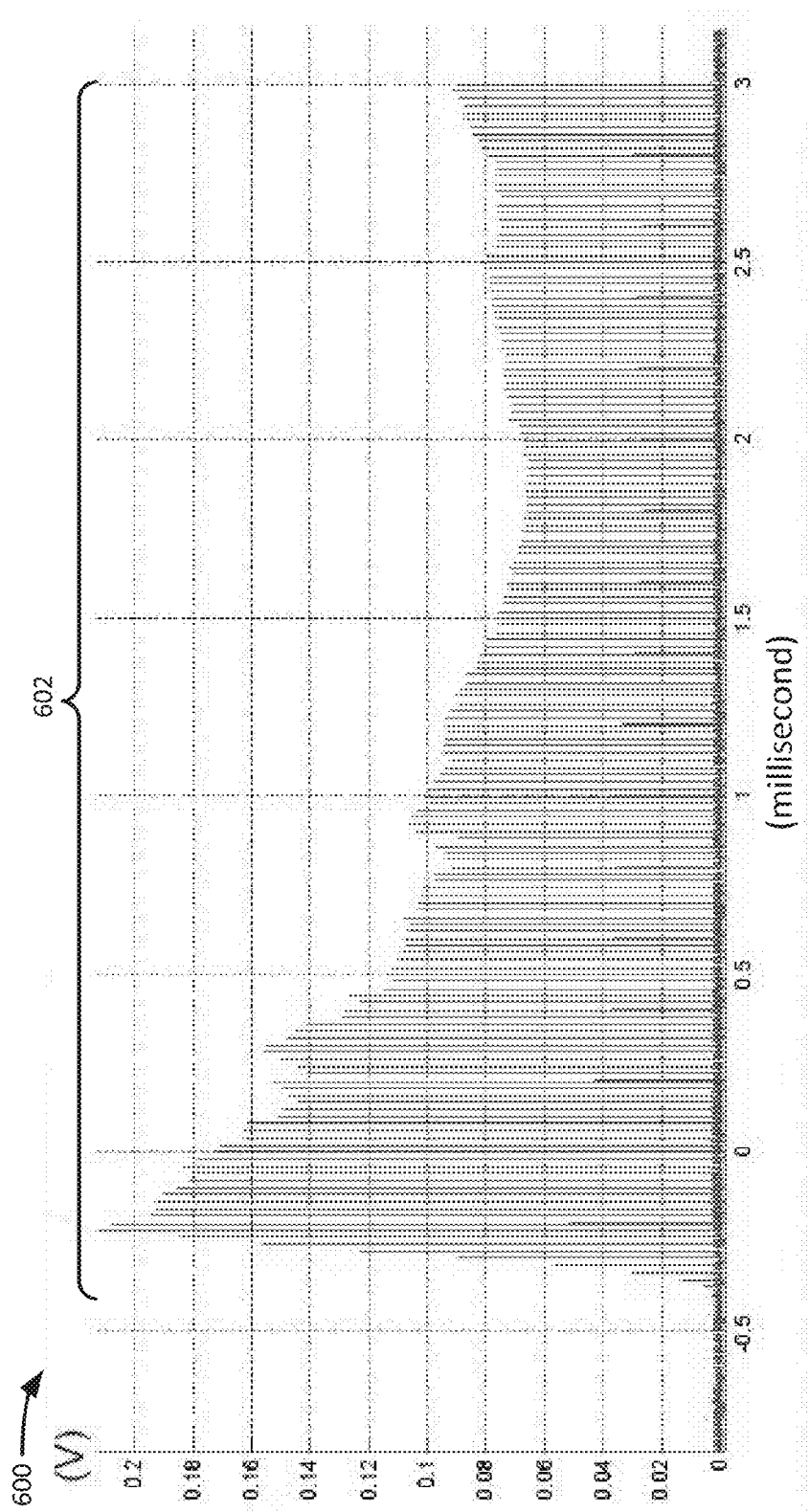
FIG. 6 is a graph output by a PEM detector depicting a temporal profile of a burst comprising pre-pulses.

FIG. 6 is a graph 600 output by the PEM detector 208 depicting a temporal profile of a burst 602 of a unitary laser beam 102 that comprises pre-pulses. The graph 600 is an actual example of the output illustrated in FIG. 3. The unitary laser beam 102 is generated by a single source but can be generated by multiple sources in other systems. In an embodiment, the pre-pulses have a wavelength of 10.26 microns. As depicted, the burst 602 has a duration of approximately 3.5 milliseconds and comprises a pre-determined number of laser pulses. According to various embodiments, a burst 602 may comprise different number of laser pulses based on the burst length. The laser pulses have a width (measured as a length of time) and an amplitude. As part of calculating the calibration coefficient, over a length of time shown in the graph 600, the calibration module 904 can integrate the pulses of the burst 602.

The calibration coefficients for the unitary laser beams 102 are calculated in the same manner for both the unitary beam comprising main pulses and the unitary beam comprising pre-pulses. First, the calibration module 904 determines the energy of the burst of the laser pulses from the average power. The energy produced during the defined period of time over which the power was measured is determined:

$$E_{total}=P_{measured}*T_{period}$$

Where $E_{total}$ is the energy of the laser beam 102 over the defined period of time, $P_{measured}$ is the power measurement taken by the power meter 202, $T_{period}$ is the defined period of time of the power meter 202 (e.g., one second). From $E_{total}$, the amount of energy within a burst is calculated using the burst rep rate:

$$E_{burst} = \frac{E_{total}}{f_{burst}}$$

Where $E_{burst}$ is the energy of a burst, $E_{total}$ is the energy of the unitary laser beam 102 over the defined period of time (e.g., one second), and $f_{burst}$ is the burst rep rate.

To determine the calibration coefficient, $K_p$, the following equation is used:

$$K_p \int V dt = E_{burst}$$

so that, $$K_p = \frac{E_{burst}}{\int V dt}$$

Where $K_p$ is the calibration coefficient, V is the voltage signal received from the PEM detector 208 such that the integral, $\int V$ dt, is the area under the curve of the voltage signal provided by the PEM detector 208 over the length of time of the burst, and $E_{burst}$ is the energy of a burst determined from the average power data received from the power meter 202. The calibration coefficient, $K_p$, has units of Watts per Volt.

The SPEC module 906 is configured to calculate the energy of a single pulse using the calibration coefficient calculated by the calibration module 904. The SPEC module 906 receives voltage data from the PEM detector 208 that comprises a temporal profile of a single pulse in a unitary laser beam (e.g., single main pulse 502 or single pre-pulse 702).

Figure 5:
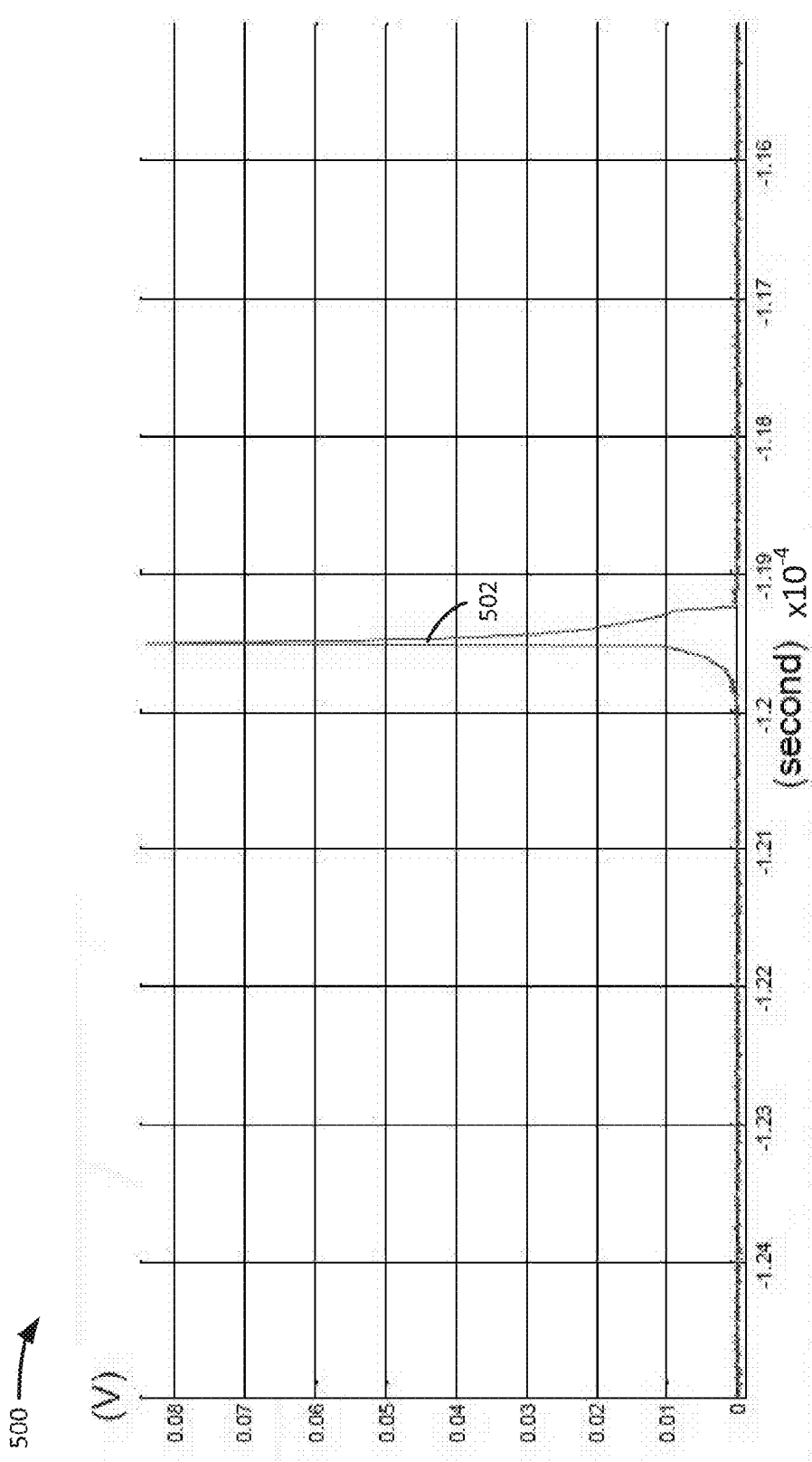
FIG. 5 is a graph output by a PEM detector depicting a temporal profile of a single main pulse.

FIG. 5 is a graph 500 output by the PEM detector 208 depicting a temporal profile of a single main pulse 502 in the unitary laser beam 102. The single main pulse 502 may be a pulse within the burst 402 or may be a pulse in a subsequent burst. The single main pulse 502 is captured by reducing the scope window 306 of the PEM detector 208. The main pulse 502 has an amplitude and a width (measured as length of time). As part of calculating an energy of the pulse 502, the SPEC module 906 can integrate the main pulse 502.

Figure 7:
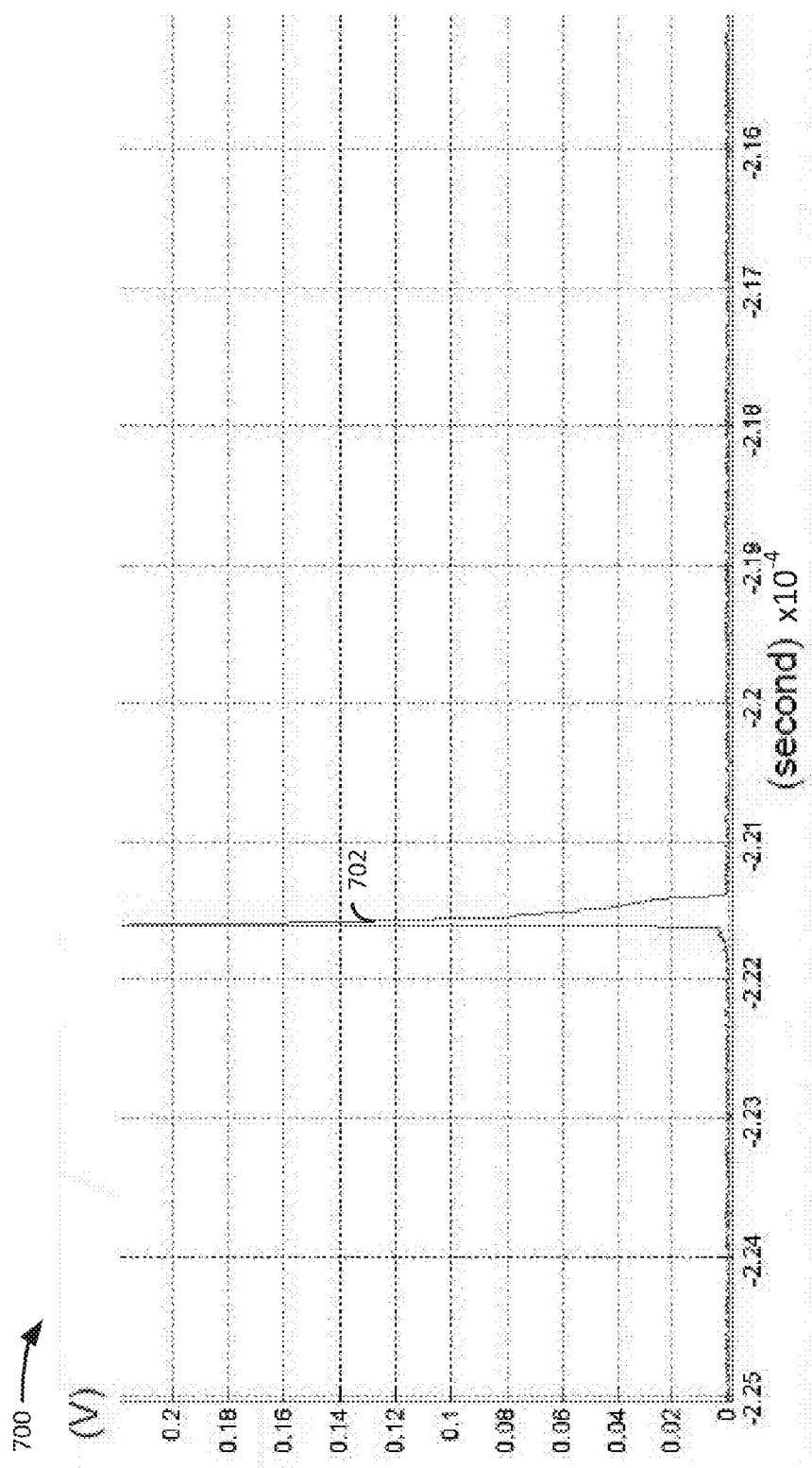
FIG. 7 is a graph output by a PEM detector depicting a temporal profile of a single pre-pulse.

FIG. 7 is a graph 700 output by a PEM detector depicting a temporal profile of a single pre-pulse 702 in the unitary laser beam 102. The single pre-pulse 702 is captured by reducing the length of time over which the PEM detector 208 measures the laser beam 102. The pre-pulse 702 has an amplitude and a width (measured as a length of time). As part of calculating the energy of the pre-pulse 702, the SPEC module 906 can integrate the pre-pulse 702.

Using the temporal profile of a single pulse, the energy of the single pulse is calculated according to the formula:

$$E_{pulse}=K_p \int V dt$$

Where $E_{pulse}$ is the energy of the pulse, $K_p$ is the calibration coefficient for pulses of the wavelength of the pulse being measured, and V is the voltage signal received from the PEM detector 208 depicting a temporal profile of the pulse being measured such that the integral, $\int V$ dt, is the area under the curve of the voltage signal provided by the PEM detector 208 over the length of time of the pulse.

The optional recalibration module 908 is configured to determine whether to recalibrate the PEM detector 208. The calibration coefficients may lose accuracy over time due to, for example, instrument drift, equipment deterioration, or degradation of the beam splitter from which the laser beam is received. In a unitary laser beam, during a subsequent burst of laser pulses (e.g., burst 402 or burst 602), the recalibration module 908 is configured to compare the power meter 202 measurement to a calculated power of the laser beam 102 using data provided by the PEM detector 208. As described herein, the comparison is made using a time period of one second. As will be apparent to those skilled in the art based on the following description, other time periods may be used, such as a burst length 304 or a burst period 308, or several burst periods.

To calculate the power of the pulses of the laser beam 102 over a period of one second, the energy of the pulses over a burst (e.g., burst 402 or 602) is determined using the calibration coefficient:

$$E_{burst}=K_p \int V dt$$

Where $K_p$ is the calibration coefficient, V is the voltage signal received from the PEM detector 208 such that the integral, $\int V$ dt, is the area under the curve of the voltage signal provided by the PEM detector 208 over the length of time of the burst, and $E_{burst}$ is the calculated energy of a burst. The sum of laser pulse energy is used to determine the total energy of the laser beam 102 over the time period:

$$E_{total}=\Sigma E_{burst}$$

Where $E_{burst}$ is the energy of a burst, $E_{total}$ is the calculated energy of the laser beam 102 over the defined period of time (e.g., one second), and $\tau E_{burst}$ is the sum of laser pulse energy over the defined period of time. To determine the power of the pulses, the total energy is divided by the time period (e.g., one second):

$$P_{calculated}=E_{total}/T_{period}$$

Where $E_{total}$ is the calculated energy of the laser beam 102 over the defined period of time, $P_{calculated}$ is a power value calculated from the voltage signal received from the PEM detector 208, and $T_{period}$ is the defined period of time (e.g., one second).

To determine whether to instruct the calibration module 904 to recalculate the calibration coefficient, the recalibration module 908, can calculate a difference between the calculated power and the measured power. The difference may be expressed as percentage. To determine whether to recalibrate, the recalibration module 908 may compare the difference to a threshold. In some instances, if the two power values are more than 15% off, the recalibration module 908 instructs the calibration module 904 to recalculate the calibration coefficient. Based on the comparison, the recalibration manager 908 can instruct the calibration module 904 to update the calibration coefficient by recalculating the calibration coefficient during a subsequent burst of the pulses of the laser beam 102.

When the energy monitor 200 or 902 is placed in the LPP EUV system 100 so as to receive a combined laser beam 102, the system 900 of FIG. 9 is further configured to determine calibration coefficient used to determine the energy of a pre-pulse in a combined laser beam 102. The energy monitor 902 is located in the LPP EUV system 100 to measure a combined laser beam 102.

To calculate the calibration coefficient of the pre-pulses in a combined laser beam 102, the calibration module 904 uses a different set of calculations than those used when calibrating for a unitary laser beam. These calculations use the calibration coefficient calculated for the unitary laser beam 102 of the main pulses to determine a portion of the power measured by the power meter 202 attributable to the main pulses, then use the remaining portion of the power to determine the calibration coefficient for the pre-pulses in the combined laser beam.

Figure 8:
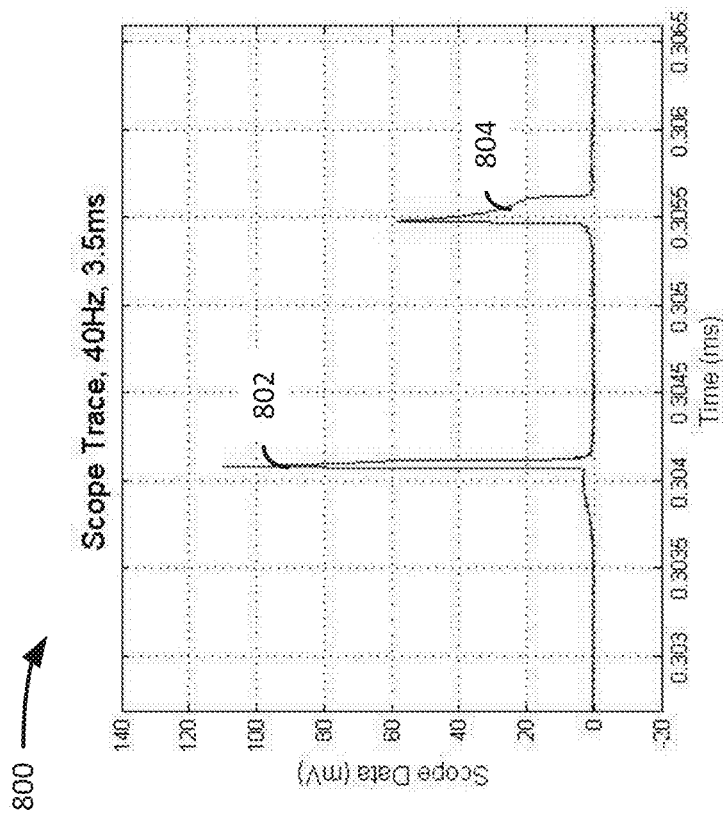
FIG. 8 is an example of a graph output by a PEM detector depicting a temporal profile of a pre-pulse and a main pulse separated by a length of time.

FIG. 8 is an example temporal profile 800 of the voltage signal output by a PEM detector 208 of a combined pulse comprising a pre-pulse and a main pulse separated by a length of time. The combined laser beam 102 is generated by combining the unitary laser beams 102 into a single laser beam so that, within a burst of the combined laser beam 102, the pre-pulses of the burst 602 alternate with the main pulses of the burst 402. As depicted in FIG. 8, a pre-pulse 802 precedes a main pulse 804 by 15 microseconds. The laser pulses have a width (measured as a length of time) and an amplitude. Over a length of time shown in the graph 800, the calibration module 904 and the SPEC module 906 can integrate the pre-pulse 802 separately from the main pulse 804. The integral is used to determine the calibration coefficient for calculating the energy of the pre-pulse and to calculate the energy of subsequent pre-pulses in a combined laser beam.

The calibration module 904 calculates the power of the main pulses of the combined beam based on a portion of the voltage signal provided by the PEM detector 208 indicating the temporal profile of the main pulse within the combined pulse. Using the temporal profile, the energy of the main pulse is calculated according to the formula:

$$E_{main\,pulse} = K_{mp} \int V dt$$

Where $E_{main\,pulse}$ is the energy of the main pulse, $K_{mp}$ is the calibration coefficient for the main pulses calculated for the unitary laser beam 102, and V is the voltage signal received from the PEM detector 208 depicting a temporal profile of the main pulse being measured such that the integral, $\int V\,dt$, is the area under the curve of the voltage signal provided by the PEM detector 208 over the length of time of the main pulse.

The average power of the combined pulse is measured by the power meter 202 over the defined period of time (e.g., one second). Based on the energy of the main pulse, the power attributable to the main pulses over the defined period of time is calculated as:

$$P_{mainpulse} = \frac{\sum E_{mainpulse}}{T_{period}}$$

Where $E_{main\,pulse}$ is the energy of the main pulse, $P_{main\,pulse}$ is the calculated power of the main pulses, $T_{period}$ is the defined period of time used by the power meter 202, and $\Sigma E_{main\,pulses}$ is the sum of the energy of the main pulses occurring over the defined period of time used by the power meter 202. To determine the portion of the power measured by the power meter 202 that is attributable to the pre-pulses, the calibration module 904 determines the difference:

$$P_{pre\text{-}pulse} = P_{measured} - P_{main\,pulse}$$

where $P_{pre\text{-}pulse}$ is the portion of the power measured by the power meter attributable to the pre-pulses of the combined pulse over the defined period of time, $P_{measured}$ is the power of the combined pulse measured by the power meter 202, and $P_{main\,pulse}$ is the calculated power of the main pulses.

Using the power attributable to the pre-pulses, the energy attributable to the pre-pulses is determined by:

$$E_{pre\text{-}pulse} = \frac{P_{pre\text{-}pulse}}{T_{period}}$$

Where $E_{pre\text{-}pulse}$ is the total energy of the pre-pulse over the defined period of time used by the power meter 202, $P_{pre\text{-}pulse}$ is the portion of the power measured by the power meter attributable to the pre-pulses of the combined pulse over the defined period of time, $T_{period}$ is the defined period of time of the power meter 202 (e.g., one second).

To determine the calibration coefficient of the pre-pulses in the combined laser beam, the following formula is used:

$$K_{pp} = \frac{E_{pre\text{-}pulse}}{\int V dt}$$

Where $K_{pp}$ is the calibration coefficient of the pre-pulses in the combined laser beam, V is the voltage signal received from the PEM detector 208 such that the integral, $\int V\,dt$, is the area under the curve of the voltage signal provided by the PEM detector 208 over at least a portion of the defined period of time, and $E_{pre\text{-}pulse}$ is the total energy of the pre-pulse over the defined period of time used by the power meter 202. The calibration coefficient, $K_{pp}$, has units of Watts per Volt.

Once the calibration coefficient of the pre-pulses in the combined laser beam is determined, the SPEC module 906 receives voltage data from the PEM detector 208 that comprises a temporal profile of a pair of a pre-pulse and a main pulse in a combined laser beam. The SPEC module 906 can then determine the energy of a subsequent pre-pulse using the formula:

$$E_{pre\text{-}pulse} = K_{pp} \int V dt$$

Where $E_{pre\text{-}pulse}$ is the energy of the single pre-pulse, $K_{pp}$ is the calibration coefficient for pulses of the pre-pulse in the combined laser beam 102, and V is the voltage signal received from the PEM detector 208 depicting a temporal profile of the pre-pulse being measured such that the integral, $\int V\,dt$, is the area under the curve of the voltage signal provided by the PEM detector 208 over the length of time of the pre-pulse.

The optional recalibration module 908 can further determine whether to recalibrate the PEM detector 208 using the power meter 202 for the pre-pulses in the combined laser beam 102, as described above. For the combined laser beam, the recalibration module 908 determines the power of the pulses by summing the energy of the pulses in the combined laser beam over a defined period of time corresponding to the power meter 202. The recalibration module 908 then compares a power calculated from the sum to the power measured by the power meter 202, as described above.

Figure 10:
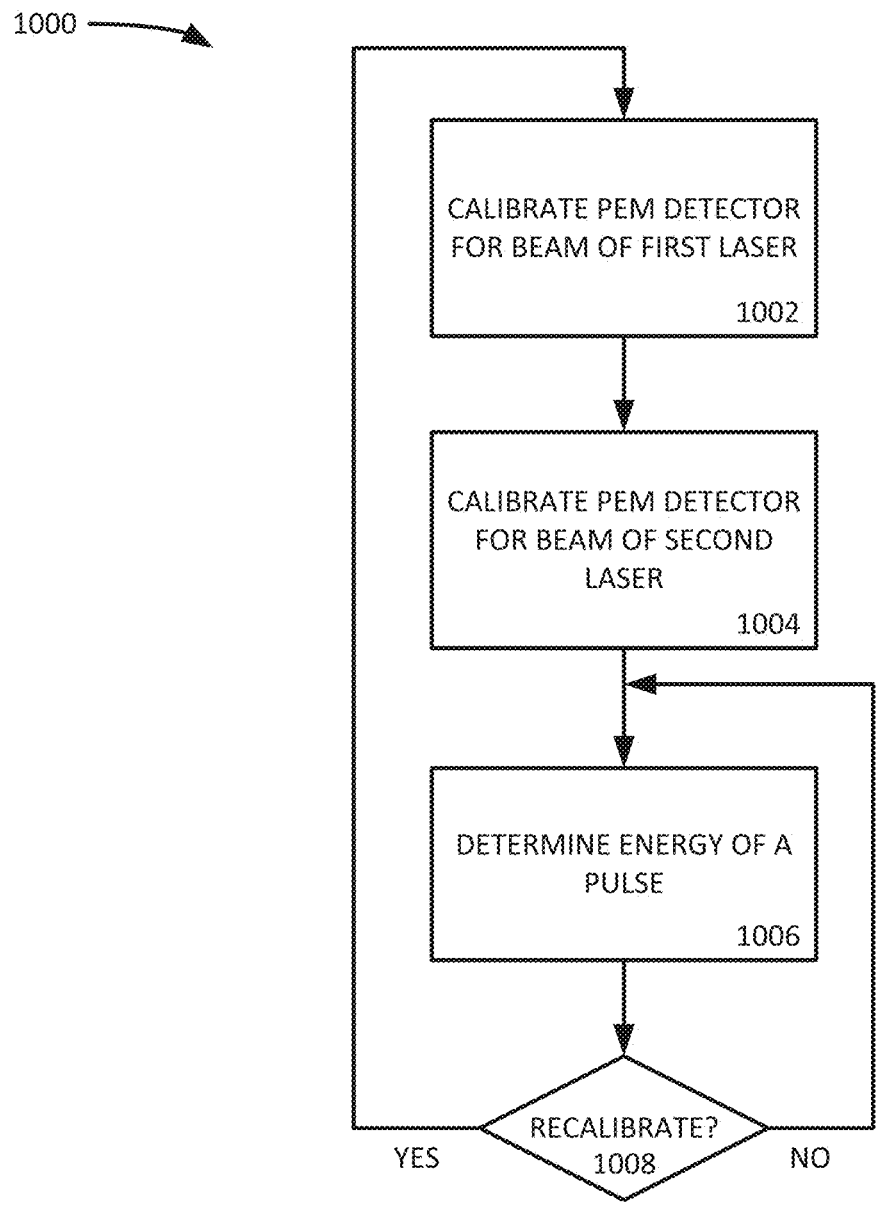
FIG. 10 is a flowchart of an example method of measuring an energy of a pulse, according to an example embodiment.

FIG. 10 is a flowchart of an example method 1000 of calculating the energy of a pulse, according to an example embodiment. The method 1000 may be performed by the system 900.

Figure 11:
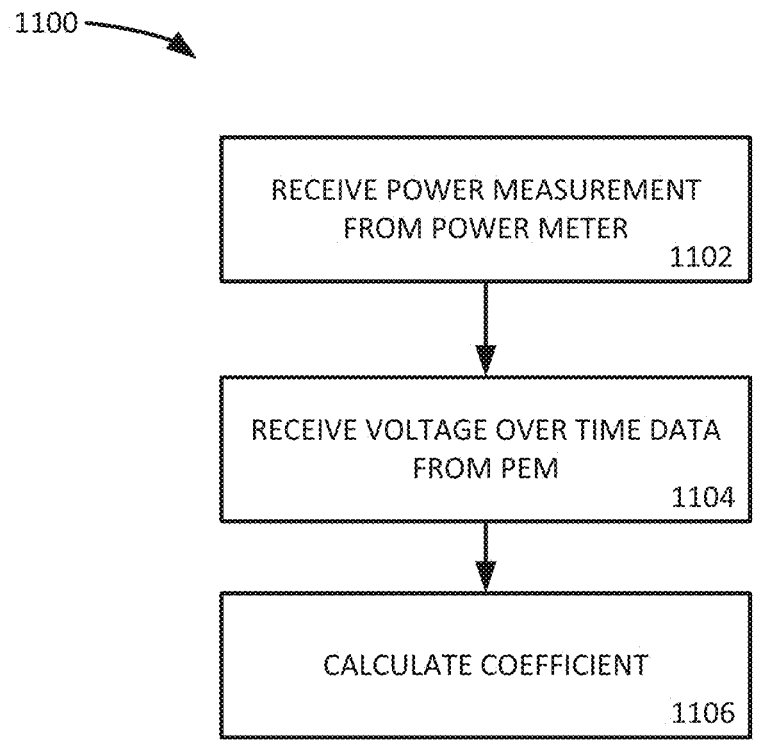
FIG. 11 is a flowchart of an example method of calibrating a photoelectromagnetic (PEM) detector using a power meter for a unitary laser beam.

In an operation 1002, a PEM detector is calibrated using a power meter for a beam of a first laser. The first laser can produce main pulses or pre-pulses in a unitary laser beam, as described above. FIG. 11 is a flowchart of an example method 1100 of calibrating a PEM detector using a power meter to determine the energy of pulses within a unitary laser beam. The method 1100 may be performed as part of operation 1002 by, for example, the energy monitor 200 or 902 and the calibration module 904 of the system 900.

In an operation 1102, a power measurement is received from the power meter (e.g., power meter 202). The power measurement indicates the average power of the pulses of the unitary laser beam 102 over a period of time.

In an operation 1104, a voltage signal over a length of time is received from a PEM detector (e.g., PEM detector 208). The voltage signal is a temporal profile of a burst of the pulses of the unitary laser beam 102. The length of time over which data is collected by the PEM detector 208 is at least one burst within the period of time of the power meter 202.

In an operation 1106, the calibration coefficient of the laser beam 102 is calculated. The calibration coefficient is calculated as described in connection with the calibration module 904. The calibration coefficient can be calculated by the calibration module 904.

If the energy monitor 200 is measuring a unitary laser beam, the method 1000 proceeds to an operation 1006, skipping operation 1004. In the operation 1006, the energy of a pulse is calculated. The energy of the pulse is calculated, for example, as described elsewhere herein in connection with the SPEC module 906. In some instances, the SPEC module 906 performs the operation 1006.

In an optional operation 1008, a determination is made as to whether to recalibrate the PEM detector by, for example, the recalibration module 908. The determination is performed by comparing a power calculated from the voltage signal provided by the PEM detector to the power measured by the power meter. If the determination is made to recalibrate, the method 1000 returns to operation 1002, or, in some instances, operation 1004. If the determination is made to not recalibrate, the method 1000 returns to operation 1006.

When the laser beam measured by the energy monitor 200 is a combined laser beam, the method 1000 proceeds from the operation 1002 to the operation 1004. The PEM detector is calibrated for a combined beam to determine an energy of a pre-pulse within the combined beam. A second laser can produce pre-pulses in bursts, as described above, which are combined with main pulses in a combined laser beam 102. In the operation 1004, the calibration coefficient for the pre-pulses in the combined laser beam 102 is determined. The calibration coefficient for the pre-pulses in the combined laser beam 102 is determined separately from that of the pre-pulses in the unitary laser beam 102 because the optical components of the LPP EUV system 100 affect the relationship between the temporal profile of the pre-pulse and the power measured by the power meter 202 after the unitary laser beams 102 are combined. The calibration coefficient of the pre-pulses is determined based on a difference between the power measured by the power meter and the power attributable to the main pulses in the combined laser beam.

Figure 12:
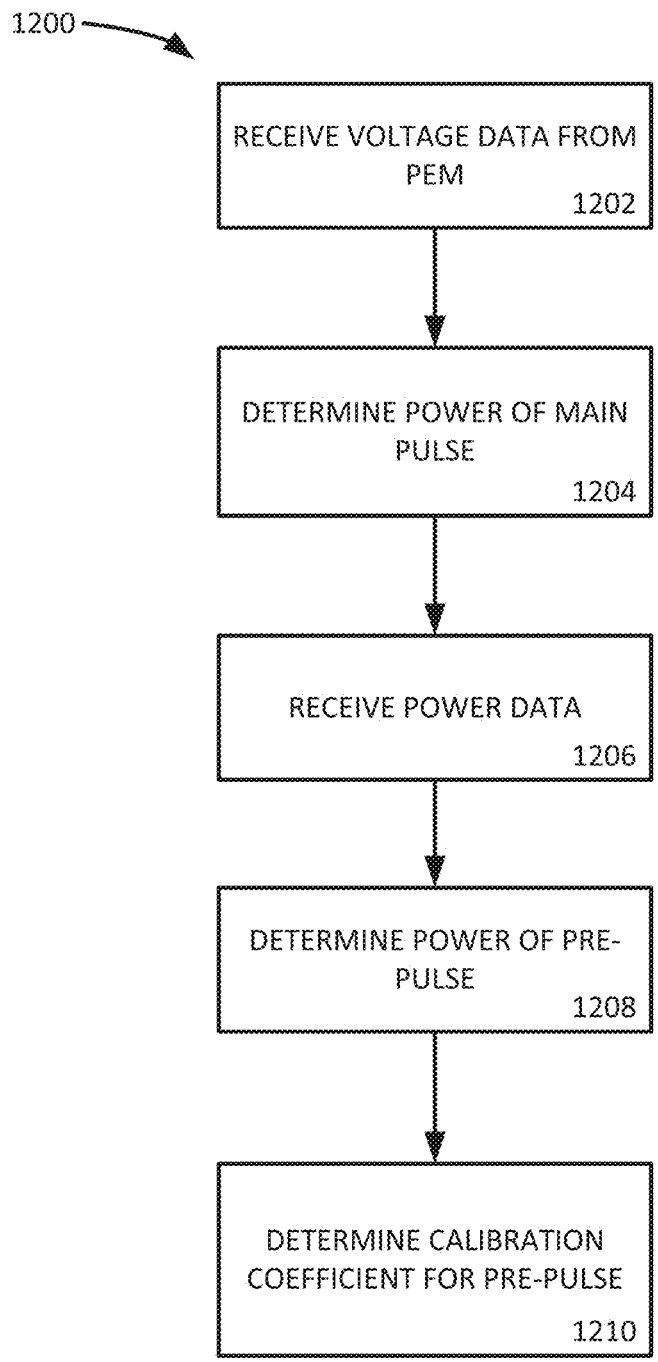
FIG. 12 is a flowchart of an example method of calibrating a PEM detector using a power meter for a combined laser beam.

FIG. 12 is a flowchart of an example method 1200 of calibrating a PEM detector (e.g., PEM detector 208) using a power meter (e.g., power meter 202) on a combined laser beam having pre-pulses and main pulses. The method 1200 is an example method of performing the operation 1004 of the method 1000 when the laser beam measured by the energy monitor 200 is a combined laser beam. The method 1200 may be performed by, for example, the calibration module 904 of the system 900.

In an operation 1202, the voltage data is received from the PEM detector 208 in the energy monitor 200 or 902. The voltage data is a temporal profile of the combined laser beam 102, as depicted in FIG. 8. The length of time over which data is collected by the PEM detector 208 is at least a portion of the period of time of the power meter 202.

In an operation 1204, the power attributable to the main pulses is determined. The power of the main pulses is determined as described in connection with the calibration module 904 and the SPEC module 906.

In an operation 1206, the power data is received from the power meter 202. The power data indicates the average power of the pulses of the combined laser beam 102 over a period of time.

In an operation 1208, the power attributable to the pre-pulses within the combined laser beam 102 is determined. The power of the pre-pulses is determined as described in connection with the calibration module 904 and the SPEC module 906.

In an operation 1210, the calibration coefficient of the pre-pulses within the combined laser beam 102 is calculated. The calibration coefficient is calculated as described in connection with the calibration module 904.

Proceeding to the operation 1006 when the laser beam measured by the energy monitor 200 is a combined laser beam, the energy of the respective main pulses and the pre-pulses in the combined laser beam are calculated as described with respect to operation 1006, above. The calibration coefficient of the operation 1002 calculated for the unitary beam of main pulses is used to calculate the energy of a main pulse in the combined laser beam. To calculate the energy of the pre-pulse in the combined laser beam, the calibration coefficient of the operation 1004 is used. When the laser beam measured by the energy monitor 200 is a combined laser beam, the method 1000 can then proceed to optional operation 1008 as described above.

The disclosed method and apparatus has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different algorithms and/or logic circuits, perhaps more complex than those described herein, may be used, as well as possibly different types of laser beam generation systems.

Further, it should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc., or communicated over a computer network wherein the program instructions are sent over optical or electronic communication links. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A system comprising:
   an energy monitor within a laser-produced plasma (LPP) extreme ultraviolet (EUV) system, the energy monitor configured to measure a laser beam comprising pre-pulses and main pulses separated by a length of time, the energy monitor comprising:
      a power meter configured to sense an average power of the series of laser pulses over a defined period of time, and
      a photoelectromagnetic (PEM) detector configured to provide a voltage signal depicting a temporal profile of the first pre-pulse separated from the first main pulse by the length of time during a portion of the defined period of time;
   a calibration module configured to determine a power of the first main pulse based on a main pulse calibration coefficient and a pulse integral of a portion of the voltage signal corresponding to the first main pulse, to determine a power of the first pre-pulse based on the average power and the power of the first main pulse, and to determine a pre-pulse calibration coefficient based on the power of the first pre-pulse and an integral of a portion of the voltage signal corresponding to the first pre-pulse; and
   a single pulse energy calculation (SPEC) module configured to determine an energy of a second pre-pulse based on the pre-pulse calibration coefficient and a pulse integral of a portion of a second voltage signal provided by the PEM detector corresponding to the second pre-pulse, and to determine an energy of a second main pulse based on the main pulse calibration coefficient and a pulse integral of a portion of the second voltage signal to the second main pulse.

2. The system of claim 1, further comprising a recalibration module configured to calculate an energy of the laser beam over a second defined period of time based on the second voltage signal provided by the PEM.

3. The system of claim 2, wherein the recalibration module is further configured to compare the calculated energy of the laser beam to the average power sensed by the power meter over the second defined period of time and to instruct to the calibration module to update the pre-pulse calibration coefficient based on the comparison.

4. The system of claim 3, wherein the recalibration module is configured to instruct the calibration module to update the pre-pulse calibration coefficient if the comparison exceeds a threshold.

5. The system of claim 1, wherein the calibration module is configured to determine the power of the first pre-pulse by subtracting the power attributable to the main pulses during the defined period of time from the average power over the defined period of time.

6. A method comprising:
   receiving a measurement of a laser beam comprising pre-pulses and main pulses using an energy monitor within a laser-produced plasma (LPP) extreme ultraviolet (EUV) system, the measurement of the laser beam comprising:
      an average power of the series of laser pulses over a defined period of time measured using a power meter, and a first voltage signal depicting a temporal profile of a first pre-pulse of the pre-pulses separated from a first main pulse of the main pulses by a length of time, the first voltage signal provided by a photoelectromagnetic (PEM) detector;
   determining a power of the first main pulse based on a main pulse calibration coefficient and an integral of a portion of the first voltage signal corresponding to the first main pulse;
   determining a power of the first pre-pulse based on the average power and the power of the first main pulse;
   determining a pre-pulse calibration coefficient based on the power of the first pre-pulse and an integral of a portion of the first voltage signal corresponding to the first pre-pulse;
   determining an energy of a second pre-pulse based on the pre-pulse calibration coefficient and an integral of a portion of a second voltage signal provided by the PEM detector corresponding to the second pre-pulse; and
   determining an energy of a second main pulse based on the main pulse calibration coefficient and an integral of a portion of the second voltage signal corresponding to the second main pulse.

7. The method of claim 6, further comprising calculating an energy of the laser beam over a second defined period of time based on the second voltage signal provided by the PEM.

8. The method of claim 7, further comprising comparing the calculated energy of the laser beam to the average power over the second defined period of time and updating the pre-pulse calibration coefficient based on the comparison.

9. The method of claim 8, wherein updating of the pre-pulse calibration coefficient is based on the comparison exceeding a threshold.

10. The method of claim 6, wherein determining the power of the first pre-pulse is performed by subtracting the power attributable to the main pulses during the defined period of time from the average power over the defined period of time.

11. A non-transitory computer-readable medium having instructions embodied thereon, the instructions executable by one or more processors to perform operations comprising:
   receiving a measurement of a laser beam comprising pre-pulses and main pulses using an energy monitor within a laser-produced plasma (LPP) extreme ultraviolet (EUV) system, the measurement of the laser beam comprising:
      an average power of the series of laser pulses over a defined period of time measured using a power meter, and a first voltage signal depicting a temporal profile of a first pre-pulse of the pre-pulses separated from a first main pulse of the main pulses by a length of time, the first voltage signal provided by a photoelectromagnetic (PEM) detector;

determining a power of the first main pulse based on a main pulse calibration coefficient and an integral of a portion of the first voltage signal corresponding to the first main pulse;

determining a power of the first pre-pulse based on the average power and the power of the first main pulse;

determining a pre-pulse calibration coefficient based on the power of the first pre-pulse and an integral of a portion of the first voltage signal corresponding to the first pre-pulse;

determining an energy of a second pre-pulse based on the pre-pulse calibration coefficient and an integral of a portion of a second voltage signal provided by the PEM detector corresponding to the second pre-pulse; and determining an energy of a second main pulse based on the main pulse calibration coefficient and an integral of a portion of the second voltage signal corresponding to the second main pulse.

\* \* \* \* \*